United States Patent [19]

Blanchard et al.

[11] Patent Number: 4,916,509
[45] Date of Patent: Apr. 10, 1990

[54] METHOD FOR OBTAINING LOW INTERCONNECT RESISTANCE ON A GROOVED SURFACE AND THE RESULTING STRUCTURE

[75] Inventors: Richard A. Blanchard, Los Altos; Adrian I. Cogan, San Jose, both of Calif.

[73] Assignee: Siliconix Incorporated, Santa Clara, Calif.

[21] Appl. No.: 336,619

[22] Filed: Apr. 7, 1989

Related U.S. Application Data

[63] Continuation of Ser. No. 120,469, Nov. 13, 1987, abandoned.

[51] Int. Cl.$^4$ .............................................. H01L 29/78
[52] U.S. Cl. .......................................... 357/65; 357/55; 357/68
[58] Field of Search ............................. 357/55, 65, 68

[56] References Cited

U.S. PATENT DOCUMENTS 4,650,544  3/1987  Erb ......................................... 357/65

OTHER PUBLICATIONS

Lu et al., IEEE Electron Device Letters, "A New Conduction Model for Polycrystalline Silicon Films", (Apr. 1981), vol. EDL-2, No. 4, pp. 95-98.
Crowder and Zirinsky, IEEE Journal of Solid-State Circuits, "um MOSFET VLSI Technology: Part VII--Metal Silicide Interconnection Technology-A Future Perspective", (Apr. 1979), vol. SC-14, No. 2, pp. 198-200.
Ghate, Physics Today, "Interconnections in VLSI", (Oct. 1986), pp. 58-66.
Zhang et al., "Self-Aligned Tantalum Silicide Process for VLSI Application", pp. 10-15, (best available citation).

Primary Examiner—Andrew J. James
Assistant Examiner—David L. Soliz
Attorney, Agent, or Firm—Steven F. Caserza

[57] ABSTRACT

In accordance with the teachings of this invention, a novel electrical interconnect structure is taught, together with the process for forming this structure. In accodance with the teachings of this invention, this structure includes an electrical interconnect layer which is formed on a grooved portion of the surface of a semiconductor device. Thus, the effective cross-sectional area of the electrical interconnect layer is increased because the electrical interconnect material is formed into the grooves. With the thickness of the electrical interconnect layer thus increased as compared with the thickness of prior art electrical interconnect layers, the sheet resistance of the electrical interconnect layer of this invention is reduced over the sheet resistance of prior art electrical interconnect layers. With a lower sheet resistance, a given length of electrical interconnect can be formed of the same resistance as in the prior art with a smaller width. Alternatively, for a given length and a given width, an electrical interconnect can be fabricated in accordance with the teachings of this invention having a lower resistance than in the prior art.

12 Claims, 1 Drawing Sheet

METHOD FOR OBTAINING LOW INTERCONNECT RESISTANCE ON A GROOVED SURFACE AND THE RESULTING STRUCTURE

This is a continuation of application Ser. No. 07/120,469 filed Nov. 13, 1987, now abandoned.

BACKGROUND OF THE INVENTION

This invention pertains to semiconductor devices, and a method for using a layer of conductive material on a grooved surface to obtain a sheet resistance that is lower than that which can be obtained on a flat surface.

In semiconductor devices, including both discrete devices and integrated circuits, it is oftentimes necessary to provide one or more layers of conductive material to serve as an electrical interconnect in addition to one or more metal layers for carrying relatively large amounts of current. A variety of materials have been used as electrical interconnect layers, such as doped polycrystalline silicon, and polycrystalline silicide. The use of polycrystalline silicon as a layer of interconnect is often an attractive choice due to the use of polycrystalline silicon elsewhere in the circuit, for example as gate electrodes of MOS devices. Combinations of polycrystalline silicon and refractory metal silicide layers, often referred to as "polycides", provide an alternative choice, which has the advantages of lower resistivity than single polycrystalline silicon layers and can be formed through selfaligned deposition processing sequences.

The use of polycrystalline silicon and polycides are described, for example, in "a new conduction model for polycrystalline silicon films", Lu et al., IEEE Electron Device Letters, Vol. EDL-2, No. 4, April 1981, pages 95–98: "1 $\mu$m MOSFET, VLSI Technology: Part VII-Metal Silicide Interconnection Technology—A Future Perspective", Crowder et al., IEEE Journal of Solid-State Circuits, Vol. SC-14, No. 2, April 1979, pages 291–293: and "Interconnections in VLSI", Prabhakar B. Ghate, Physics Today, October 1986, pages 58–66.

FIG. 1 is a cross-sectional view of a typical prior art semiconductor structure including substrate 10, an insulating layer 11, such as silicon dioxide, and electrical interconnect layer 12, which has been patterned to form a desired wiring pattern. Width W of electrical interconnect layer 12 can be made of any convenient size, dependent of course upon the nature of the semiconductor device with which it is used. In other words, it is desired to make width W relatively small so as not to consume very much surface area of the semiconductor device. The thickness t of electrical interconnect layer 12 can also be made within a wide range of sizes, but is typically on the order of 0.3 to 2.5 $\mu$m thick. The resistance of an electrical interconnect of length L (measured perpendicular to the cross-sectional view of FIG. 1) is equal to the $$R = \frac{R_s L}{W}; \text{ where} \quad (1)$$

R is the resistance of a length L of electrical interconnect layer 12;

$R_s$ is the sheet resistance of electrical interconnect layer 12;

L is the length of electrical interconnect layer 12; and

W is the width of electrical interconnect layer 12.

In turn, sheet resistance $R_s$ is defined by the following equation $$R_s = 4.5 \frac{V}{I},$$

with the thickness of the layer being much less than the probe spacing.

In the prior art structure of FIG. 1, in order to reduce the resistance R of electrical interconnect layer 12 with a given thickness, it is necessary to do one or more of the following things:

1. Increase with W. However, this is undesirable as it requires additional surface area on the semiconductor device.

2. Decrease length L. This is desirable, although length L is dictated by the placement of components within the semiconductor device which are to be electrically connected by electrical interconnect layer 2.

3. Decrease the sheet resistance $R_s$.

The sheet resistance of a polycrystalline silicon layer can be reduced to about 10 ohms/square. Below this value of sheet resistance, metals such as aluminum or refractory metals, or polycide combinations must be used to achieve even lower sheet resistance values. It is preferred to have polycrystalline silicon as, at least, the first electrical interconnect layer because multiple interconnect layer processes are complicated and the use of polycrystalline silicon as at least first interconnect layer serves to simplify such processes.

Accordingly, it is desirable to minimize the sheet resistance and the overall resistance of an electrical interconnect layer. Prior art techniques allow for the reduction of sheet resistance to within the range of approximately 1 to 10 ohms/square, but sheet resistance of typical electrical interconnect layers cannot be reduced lower due to geometrical size and process related limitations. Therefore, prior art techniques for fabricating electrical interconnect layers have a lower limit of electrical resistance which has heretofore not been broken.

SUMMARY

In accordance with the teachings of this invention, a novel electrical interconnect structure is taught, together with the process for forming this structure. In accordance with the teachings of this invention, this structure includes an electrical interconnect layer which is formed on a grooved portion of the surface of a semiconductor device. Thus, the effective cross-sectional area of the electrical interconnect layer is increased because the electrical interconnect material is formed into the grooves. With the thickness of the electrical interconnect layer thus increased as compared with the thickness of prior art electrical interconnect layers, the sheet resistance of the electrical interconnect layer of this invention is reduced over the sheet resistance of prior art electrical interconnect layers. With a lower sheet resistance, a given length of electrical interconnect can be formed of the same resistance as in the prior art with a smaller width. Alternatively, for a given length and a given width, an electrical interconnect can be fabricated in accordance with the teachings of this invention having a lower resistance than in the prior art.

BRIEF DESCRIPTION OF THE DRAWINGS

FIG. 5 is a plan view of one embodiment of this invention.

DETAILED DESCRIPTION

Figure 1:
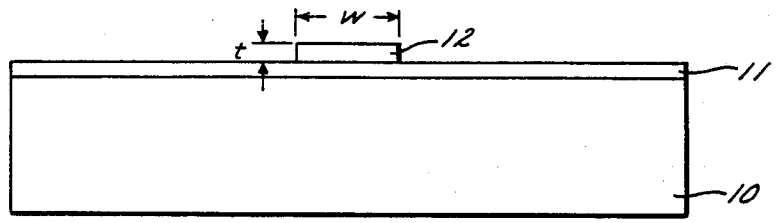
FIG. 1 is a cross-sectional view of a prior art semiconductor device including an electrical interconnect.
Figure 2:
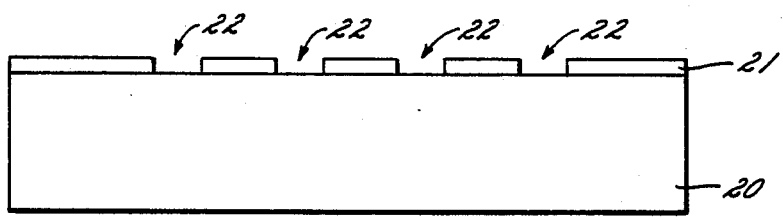
FIGS. 2 through 4 are cross-sectional views depicting the fabrication of an electrical interconnect layer in accordance with the teachings of this invention.
Figure 3:
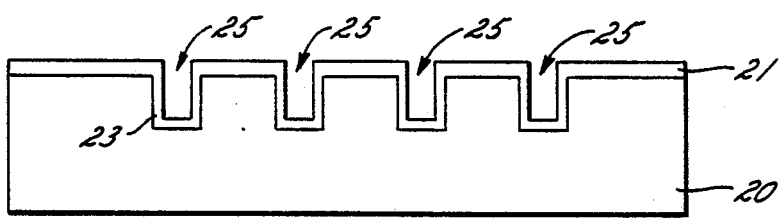

As shown in FIG. 2, a semiconductor substrate 20, such as a silicon substrate of any convenient doping, is used. Formed on the top surface of substrate 20 is a dielectric layer 21, for example a silicon dioxide layer formed to a thickness of approximately 0.1 to 1.0 μm by thermal oxidation. A layer of photoresist (not shown) is formed on the surface of dielectric layer 21 and defined using suitable photolithographic techniques to expose those portions of dielectric layer 21 which are to be removed where to-be-formed grooves 25 (FIG. 3) are to be formed. The portions of dielectric layer 21 which are exposed by the photoresist are then removed, for example, by etching both dry (plasma) and wet etching are suitable for patterning dielectric layer 21. As shown in FIG. 3, the portions of substrate 20 which are exposed by openings 22 in dielectric layer 21 are then etched in order to form one or more grooves 25 in substrate 20, running laterally between first and second spaced apart locations on the surface of substrate 20 which are to be electrically interconnected. When substrate 20 is a silicon substrate, grooves 25 may be formed to a depth, for example, within the range of approximately 0.5 to 5.0 μm, for example, by using a chlorine-based anisotropic dry etching process, such as reactive ion etching (RIE). Grooves 25 have a width within the range of approximately 0.5 to 5.0 μm, for example.

Next, as shown in FIG. 3, the bottom and sides of grooves 25 are covered with a layer 23 of dielectric material. This may be performed, for example, by oxidizing substrate 20 to form dielectric layer 23 of silicon dioxide material (when substrate 20 is silicon), or by depositing a layer of dielectric, such as silicon dioxide or silicon nitride which can be deposited, for example, by low pressure chemical vapor deposition. Dielectric layer 23 is formed to a thickness, for example, within the range of approximately 0.2 to 1.0 μm.

Figure 4:
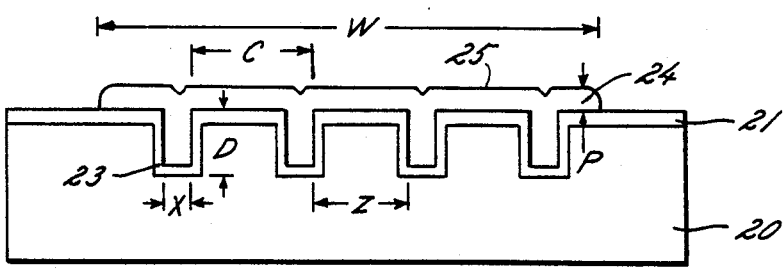

As shown in FIG. 4, a layer of conductive material 24 is formed on a portion of the surface of the wafer, and fills the one or more grooves 25 which have been formed. Of importance, dielectric layers 21 and 23 electrically insulate conductive layer 24 from substrate 20. In one embodiment of this invention, the material used to form electrical interconnect layer 24 is polycrystalline silicon which is formed to a thickness P of approximately 0.3 to 3.0 μm, and completely fills grooves 25. The electrical interconnect layer 24 is then patterned as shown in FIG. 4 to provide the desired interconnect pattern, as is well known in the art. It is desired to provide polycrystalline silicon layer 24 such that it has a smooth, planar surface such that additional layers can be conveniently formed above polycrystalline silicon layer 24. This can be achieved through conventional planarization techniques well known in the art.

As shown in FIG. 4, the patterned electrical interconnect layer 24 has an overall width W, and a length L perpendicular to the plane of the cross-sectional view of FIG. 4. It is these two values which determine the surface area of the wafer which is required for the placement of this electrical interconnect. However, additional dimensions are of importance to determine the resistance of the electrical interconnect layer. As shown in FIG. 4, the width of electrically conductive material within grooves 25 has a value X. The interstitial spacing between the electrically conductive material between adjacent grooves 25 has a distance Z. The depth of electrically conductive material within each groove has a distance D. The thickness of electrical interconnect layer 24 above dielectric layer 21 has a value P. The overall width of a single groove 25 and its associated portion of electrical interconnect layer 24 which is located solely above dielectric layer 21 has a distance of C. Thus, the resistance of electrical interconnect layer 24 is approximately defined by the following equation when a large number (greater than 5) grooves are present such that the contribution of the portions of interconnect layer 24 outside of the grooved area is minimal:

$$R = \left[ \frac{1}{1 + \frac{XD}{CP}} \right] \frac{R_s L}{W} \quad (2)$$

This is seen from the following facts: 1. The resistance of a given body is equal $$\frac{R_s L}{W}$$

2. For a given cell in FIG. 3, the cross-sectional area of the interconnect layer, excluding the grooves, is equal to CP.

3. For a given cell in FIG. 3, the cross-sectional area of the interconnect layer within the groove is equal to XD.

4. Using grooves as taught by this invention increases the cross-sectional area of the interconnect layer by a factor of:

$$\frac{CP + XD}{CP} = 1 + \frac{XD}{CP}$$

5. Resistance is inversely proportional to cross-sectional area, so using grooves as taught by this invention reduced the resistance by a factor of $$\frac{1}{1 + \frac{XD}{CP}}$$

Thus, the resistance of an electrical interconnect constructed in accordance with the teachings of this invention is reduced from the resistance of an electrical interconnect in accordance with the prior art by a factor of $$\frac{1}{1 + \frac{XD}{CP}} \quad (3)$$

The following example shows the utility of this invention in reducing the overall resistance of an electrical interconnect layer formed in accordance with the teachings of this invention as compared with an electrical interconnect layer of the same sheet resistance, length L and width W as formed in the prior art. Assume the following values:

P = 0.5 microns
X = 1.0 microns
C = 3.0 microns
D = 3 microns

Accordingly, the teachings of this invention are very useful in reducing the resistance of electrical interconnects in semiconductor devices. The teachings of this invention can be used with any semiconductor material, and any type of electrically conductive material forming the electrical interconnect layer. Thus, this invention has utility with electrical interconnect materials such as aluminium, alloys of aluminum, polycrystalline silicon, polycrystalline silicide, the successive layers of polycrystalline silicon and refractory metal, and successive layers of different metals. The grooves may be formed to any convenient depth, and any number of grooves, including a single groove, may be used, thereby increasing the effective cross-sectional area of the electrical interconnect, thereby reducing its resistance as compared with prior art electrical interconnects.

FIG. 5 is a plan view depicting one embodiment of a structure fabricated in accordance with the teachings of this invention. As shown in FIG. 5, substrate 20 includes first and second spaced apart locations 51 and 52, which are laterally displaced on the surface of substrate 20. Between locations 51 and 52 run grooved interconnects 53-1 through 53-4 as fabricated in accordance with the teachings of this invention.

All publications and patent applications are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

What is claimed is:

1. A structure comprising:
   a substrate;
   a first location on the surface of said substrate;
   a second location on the surface of said substrate which is to be electrically interconnected via a DC path to said first location;
   one or more grooves formed in said substrate, said one or more grooves extending laterally from said first location to said second location; and
   a conductive layer formed in said one or more grooves, thereby forming an electrically conductive DC path between said first and second location.

2. A structure as in claim 1 which further comprises means for electrically insulating said conductive layer from said substrate.

3. A structure as in claim 2 wherein said means for electrically insulating comprises a dielectric layer formed on the sides and bottoms of said one or more grooves.

4. A structure as in claim 3 wherein said dielectric layer is also formed on said surface of said substrate adjacent at least a part of said grooves.

5. A structure as in claim 1 wherein said substrate comprises a semiconductor.

6. A structure as in claim 5 which further comprises means for electrically insulating said conductive layer from said substrate.

7. A structure as in claim 6 wherein said means for electrically insulating comprises a dielectric layer formed on the sides and bottoms of said one or more grooves.

8. A structure as in claim 7 wherein said dielectric layer is also formed on said surface of said substrate adjacent at least a part of said grooves.

9. A structure as in claim 7 wherein said dielectric layer comprises an oxide of said semiconductor.

10. A structure as in claim 5 wherein said conductive layer comprises a material selected from the group of materials consisting of aluminum, alloys of aluminum, polycrystalline silicon, refractory metals, and combinations of polycrystalline silicon and refractory metals.

11. A structure as in claim 1 wherein said conductive layer is also formed on the surface of said substrate adjacent at least a portion of said one or more grooves.

12. A structure as in claim 3 wherein said dielectric layer has a thickness within the range of approximately 2,000 to 10,000Å.

* * * * *